United States Patent
Zhou

(10) Patent No.: US 10,424,662 B2
(45) Date of Patent: Sep. 24, 2019

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/863,480

(22) Filed: Jan. 5, 2018

(65) Prior Publication Data

US 2018/0197987 A1    Jul. 12, 2018

(30) Foreign Application Priority Data

Jan. 6, 2017  (CN) .......................... 2017 1 0011800

(51) Int. Cl.
*H01L 29/786* (2006.01)
*H01L 29/78* (2006.01)
(Continued)

(52) U.S. Cl.
CPC .. *H01L 29/7825* (2013.01); *H01L 21/823821* (2013.01); *H01L 27/0886* (2013.01); *H01L 27/0924* (2013.01); *H01L 29/0649* (2013.01); *H01L 29/407* (2013.01); *H01L 29/66545* (2013.01); *H01L 29/66659* (2013.01); (Continued)

(58) Field of Classification Search
CPC ............. H01L 29/0653; H01L 29/7816; H01L 29/7835; H01L 29/785; H01L 29/66681; H01L 29/66795; H01L 29/7851; H01L 29/0649; H01L 29/66659; H01L 29/66545; H01L 21/823821; H01L 27/0886; H01L 27/0924
See application file for complete search history.

(56) References Cited

U.S. PATENT DOCUMENTS 9,082,852 B1 *  7/2015  Liu ................. H01L 29/785
9,634,138 B1 *  4/2017  Choi ............... H01L 29/66545
(Continued)

*Primary Examiner* — Zandra V Smith
*Assistant Examiner* — Jeremy J Joy
(74) *Attorney, Agent, or Firm* — Anova Law Group, PLLC

(57) ABSTRACT

Semiconductor structures and fabrication methods thereof are provided. An exemplary semiconductor structure includes a base substrate having a first well and a second well region; a first insulation layer over the base substrate and dividing the second well region into a first region adjacent to the first well region, a second region away from the first well region and a third region under the first insulation layer; a gate structure over the base substrate in the first well region and the first region of the second well region; a first mask gate structure on a portion of the second region adjacent to the first region; a first stress layer on the first well region at a side of gate structure away from the first insulation layer; and a second stress layer on the second well regions at a side of the mask gate structure away from the isolation layer.

14 Claims, 4 Drawing Sheets

(51) Int. Cl.
  *H01L 29/66*     (2006.01)
  *H01L 29/40*     (2006.01)
  *H01L 29/06*     (2006.01)
  *H01L 27/092*    (2006.01)
  *H01L 27/088*    (2006.01)
  *H01L 21/8238*   (2006.01)

(52) U.S. Cl.
  CPC .. *H01L 29/66681* (2013.01); *H01L 29/66689* (2013.01); *H01L 29/66704* (2013.01); *H01L 29/66795* (2013.01); *H01L 29/7816* (2013.01); *H01L 29/7823* (2013.01); *H01L 29/7835* (2013.01); *H01L 29/7848* (2013.01); *H01L 29/7851* (2013.01); *H01L 29/7853* (2013.01); *H01L 29/7856* (2013.01); *H01L 29/78624* (2013.01)

(56) References Cited

U.S. PATENT DOCUMENTS

| | | | |
|---|---|---|---|
| 2014/0210009 A1* | 7/2014 | Xiao | H01L 29/66795 257/365 |
| 2015/0076610 A1* | 3/2015 | Ito | H01L 29/785 257/365 |
| 2016/0163850 A1* | 6/2016 | Liu | H01L 29/785 257/338 |
| 2016/0181358 A1* | 6/2016 | Zhang | H01L 29/66689 257/339 |
| 2017/0018551 A1* | 1/2017 | Ponoth | H01L 27/0924 |
| 2017/0229570 A1* | 8/2017 | Cheng | H01L 29/785 |
| 2018/0012967 A1* | 1/2018 | Kang | H01L 21/823807 |
| 2018/0108755 A1* | 4/2018 | Liu | H01L 29/7851 |

\* cited by examiner

SEMICONDUCTOR STRUCTURE AND FABRICATION METHOD THEREOF

CROSS-REFERENCES TO RELATED APPLICATIONS

This application claims the priority of Chinese patent application No. 201710011800.7, filed on Jan. 6, 2017, the entirety of which is incorporated herein by reference.

FIELD OF THE DISCLOSURE

The present disclosure generally relates to the field of semiconductor manufacturing technologies and, more particularly, relates to semiconductor structures and fabrication methods thereof.

BACKGROUND

Laterally diffused metal oxide semiconductor (LDMOS) is a commonly used type of high voltage devices and has an easy compatibility with CMOS process. LDMOS is a power device with a dual diffusion structure. Two ion implantation processes are performed in a same source/drain region. The doping ions in a first implantation process are arsenic ions with a higher concentration and the doping ions in a second ion implantation process are boron ions with a lower concentration. A high temperature activation process is performed after the ion implantation processes. Because the diffusion rate of the arsenic ions is greater than that of the boron ions, boron ions may laterally diffuse further below the interface between the gate structure and the substrate, a channel region with a concentration gradient is formed. The channel length of the LDMOS is determined by the difference between the diffusion distances of the two lateral diffusions.

To improve the voltage withstanding performance of the LDMOS, a drift region is disposed between the source region and the drain region. The doping concentration of the drift region is relatively low. Therefore, when a high voltage is applied to the LDMOS, because the resistance of the drift region is relatively high, the component voltage is relatively high. Thus, the LDMOS is able to withstand a sufficiently high voltage.

However, there is a need to improve the voltage withstanding performance of LDMOS. The disclosed methods and semiconductor structures are directed to solve one or more problems set forth above and other problems in the art.

BRIEF SUMMARY OF THE DISCLOSURE

One aspect of the present disclosure includes a semiconductor structure. The semiconductor structure includes a base substrate, having a first well region doped with a first type of doping ions and a second well doped with a second type of doping ions; a first insulation layer over the base substrate in the second well region and dividing the second well region into a first region adjacent to the first well region, a second region away from the first well region and a third region under the first insulation layer; a gate structure over the base substrate in the first well region and the first region of the second well region; a first mask gate structure over the base substrate on a portion of the second region adjacent to the first region; a first stress layer on the first well region at a side of gate structure away from the first insulation layer; and a second stress layer on the second well regions at a side of the mask gate structure away from the isolation layer.

Another aspect of the present disclosure includes a method for fabricating a semiconductor structure. The method includes providing a base substrate having a first well region doped with a first type of doping ions and a second well region doped with a second type of doping ions adjacent to the first well region; forming a first insulation layer in the second well region, wherein the first insulation layer divides the second well region into a first region adjacent to the first well region, a second region away from the first well region and a third region under the first insulation layer; forming a gate structure on the first well region and a first mask gate structure on the second well region, wherein the gate structure is also formed on the first region of the second well region and the first mask gate structure is formed on a portion of the second region adjacent to the first region; and forming a first stress layer on the first well region at a side of gate structure away from the first insulation layer and a second stress layer on the second region at a side of the mask gate structure away from the isolation layer.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
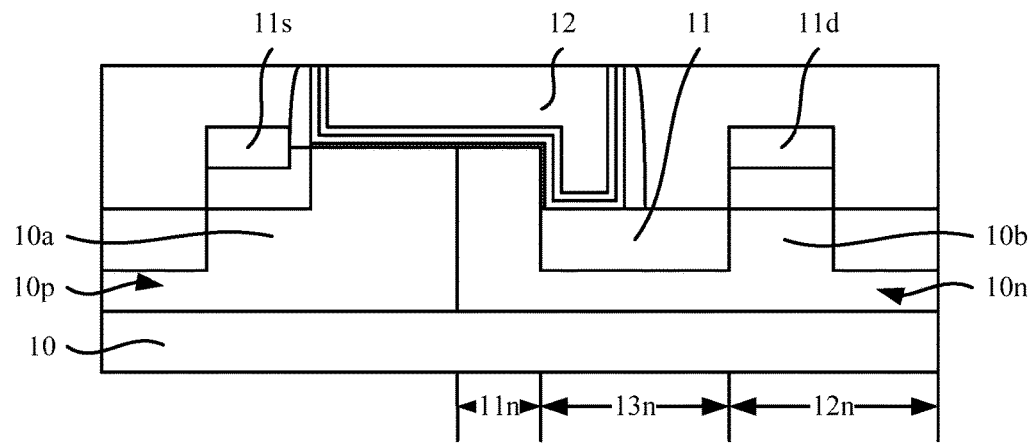
FIG. 1 illustrates a cross-sectional view of a semiconductor structure.

FIG. 1 illustrates a cross-sectional view of a semiconductor structure. As shown in FIG. 1, the semiconductor structure includes a base substrate 10; a P-type well region 10$p$ and an N-type well region 10$n$ adjacent to the P-type well region 10$p$ formed in the base substrate 10; an insulation structure 11 formed in N-type well region 10$n$, with the top surface of below the top surfaces of the P-type well region 10$p$ and the N-type well region 10$n$, and dividing the N-type well region 10$n$ into a first region 1 in adjacent to the P-type well region 10$p$, a second region 12$n$ away from the P-type well region 10$p$ and a third region 13$n$ under the insulation structure 11; a gate structure 12 on the P-type well region 10$p$, the first region 1 in of the N-type well region 10$n$ and a portion of the insulation structure 11; a first stress layer 11$s$ in the P-type well region 10$p$ at one side of the gate structure 12 and used to form the source region of the semiconductor structure; a second stress layer 11$d$ in the N-type well region 10$n$ at the side away from the gate structure 12 and used to form the drain region of the semiconductor structure. The N-type well region 10$n$ is a drift region with a lower doping concentration. Thus, the N-type well region may have a higher divided voltage when a high voltage is applied on the semiconductor structure.

With the continuous increase of the device density and the integration level of semiconductor devices, the gate size of the planar transistor is also getting shorter and shorter. The control ability of the conventional planar transistors to the their channel regions become worse. Thus, the short channel effect is easy to occur. In order to overcome the short channel effect of the transistors and suppress the leakage current, fin field-effect transistors (FinFETs) have been developed.

Therefore, a first fin 10a and an adjacent second fin 10b are formed on the surface of the base substrate 10. The P-type well region 10p and the N-type well region 10n are in the first fin 10a; and aligned along the direction from the first fins 10a to the second fin 10b and the N-type well region 10n extends into the second fin 10b. The insulation structure 11 is between the first fin 10a and the second fin 10b, and covers a portion of each of the side surfaces of the first fin 10a and the second fin 10b. Further, the gate structure 12 covers portions of the top surface and side surfaces of the first fin 10a. Further, a first stress layer 11s is disposed in the first fin 10a exposed by the gate structure 12; and a second stress layer 11d is disposed the second fins 10b.

As shown in FIG. 1, only the second stress layer 11d is formed on the second fin 10b. Along the length direction of the second fin 10b, the second stress layer 11d extends from one end of the second fin 10b to the other end. That is, the drain region of the semiconductor structure extends from one end of the second fin 10b to the other end along the length direction of the second fin 10b. Thus, the distance between the source region and the drain region of the semiconductor structure is substantially short. Accordingly, the current path of the semiconductor structure may be substantially short when the semiconductor structure is in operation; and the improvement of the voltage withstanding performance of the semiconductor structure is limited.

The present disclosure provides a semiconductor structure and a fabrication method thereof. The disclosed method may include providing a base substrate having a first well region and a second well region adjacent to the first well region. The first well region may have a first type of doping ions and the second well region may have a second type of doping ions. The method may also include forming a first insulation layer in the second well region. The first insulation layer may divide the second well region into a first region adjacent to the first well region, a second region away from the first well region and a third region under the first insulation layer. Further, the method may include forming a gate structure on the first well region and a first mask gate structure on the second well region. The gate structure may also be formed on the first region of the second well region and the first mask gate structure may be formed on a portion of the second region adjacent to the first region. Further, the method may include forming the doped source/drain regions in the first well region exposed by the gate structure and the second region of the second well region exposed by the first mask gate structure, respectively.

In the present disclosure, the first mask gate structure may be formed on a portion of the second region of the second well region close to the first region, one of the doped source region and the doped drain region may be subsequently formed in the second region of the second well region exposed by the first mask gate structure. That is, one of the doped source region and the doped drain region may be at one side of the first mask gate structure away from the first well region. Therefore, disposing the first mask gate structure may increase the distance between the doped source/drain regions respectfully formed in the second well region and the first well region. Such a structure may further increase the distance between the source region and the drain region of the semiconductor structure; increase the length of the current path after the semiconductor structure is turned on; and enhance the voltage withstanding performance of the semiconductor structure.

Figure 9:
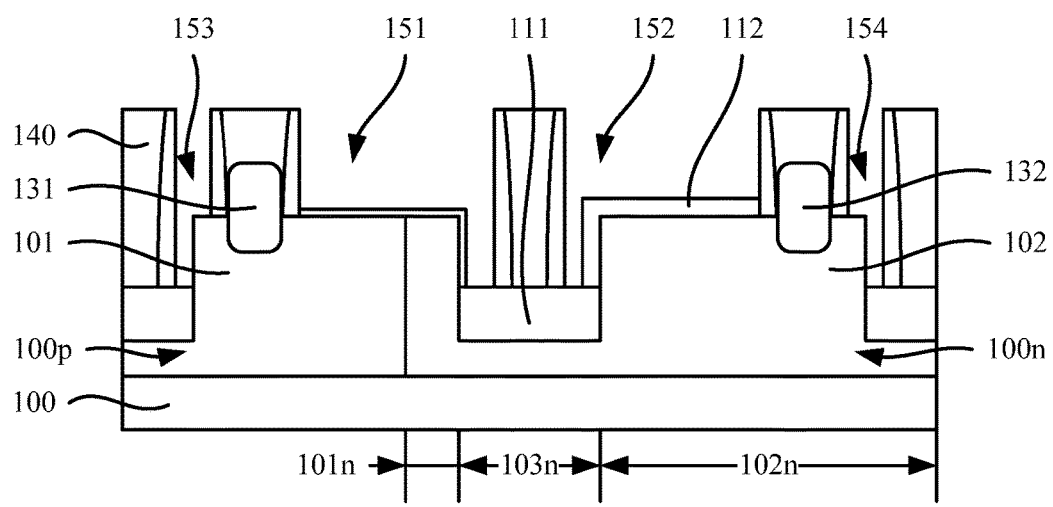
Figure 10:
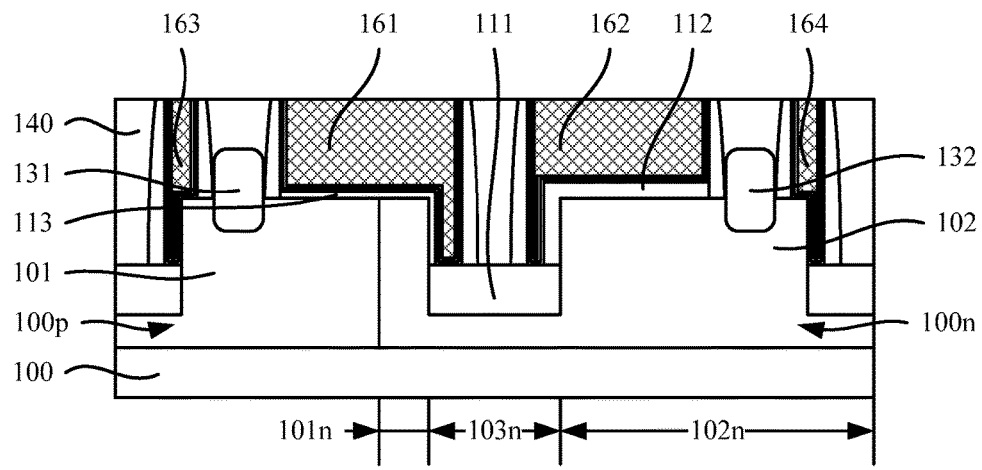
Figure 11:
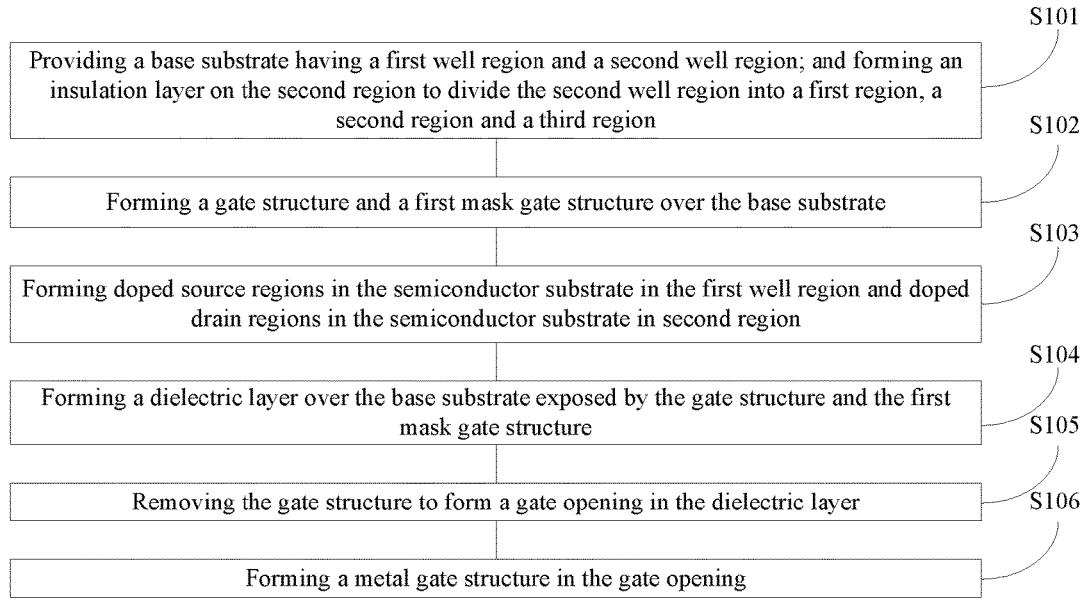
FIG. 11 illustrates an exemplary fabrication process of a semiconductor structure consistent with the disclosed embodiments.

FIG. 11 illustrates an exemplary fabrication process of a semiconductor structure consistent with various disclosed embodiments. FIGS. 2-10 illustrate the cross-sectional views of semiconductor structures corresponding to certain stages during the exemplary fabrication process.

Figure 2:
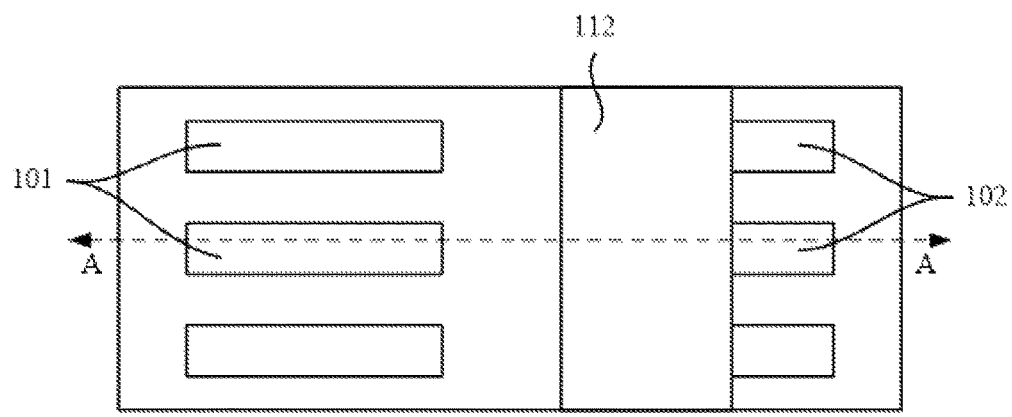
FIGS. 2-10 illustrate structures corresponding to certain stages during an exemplary fabrication process of a semiconductor structure consistent with various disclosed embodiments.
Figure 3:
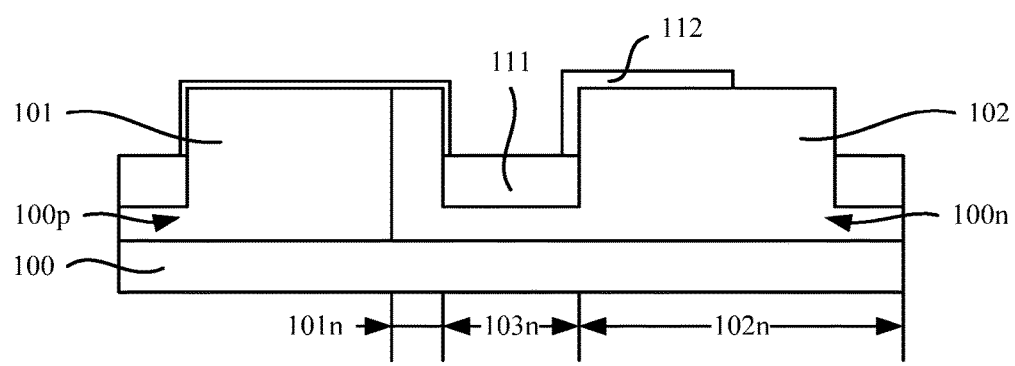

As shown in FIG. 11, at the beginning of the fabrication process, a base substrate with certain structures is provided (S101). FIGS. 2-3 illustrate a corresponding semiconductor structure. FIG. 3 is the cross-section view of the semiconductor structure illustrated in FIG. 2 along the "AA" direction.

As shown in FIGS. 2-3, a base substrate is provided. The base substrate may include a first well region 100p and a second well region 100n adjacent to the first well region 100p. The first well region 100p may have a first type of doping ions and the second well region 100p may have a second type of doping ions.

The base substrate provides a process platform. The first well region 100p may be used as the lateral diffusion region to form a channel having a concentration gradient. The second well region 100n may be used as the drift region to withstand a higher divided voltage.

In one embodiment, the first well region 100p may be a P-type well region. That is, the first type of doping ions may be P-type ions, such boron ions, gallium ions, or indium ions, etc. The second well region 100n may be an N-type well region. That is, the second type of doping ions may be N-type ions, such phosphor ions, arsenide ions, or antimony ions, etc.

In one embodiment, the semiconductor structure is a fin field-effect transistor (FinFET). The base substrate may include a semiconductor substrate 100, a plurality of first fins 101 and a plurality of second fins 102 on the semiconductor substrate 100. In some embodiments, the number of the first fin and the number of the second fin may be one.

The first fins 101 and the second fins 102 may be distributed along the length direction one of the first fins 101 and the second fins 102. The first well region 100p and the second well region 100n may be in the first fins 101 and distributed along a direction from the fins 101 to the second fins 102. The second well region 100n may extend into the second fins 102.

The semiconductor substrate 100 provides a process platform. In one embodiment, the semiconductor substrate 100 is made of single crystal silicon. In some embodiments, the semiconductor substrate may be a polysilicon substrate, an amorphous silicon substrate, a silicon germanium substrate, a silicon carbide substrate, a silicon on insulator (SOI) substrate, a silicon insulator on germanium (GOI) substrate, a glass substrate, or a group III-V compound substrate, including gallium nitride and gallium arsenide, etc. The material of the semiconductor substrate 100 may be selected to meet the requirements in processing and/or integration.

The first fins 101 may be used to provide the channels of the fin field-effect transistor. The second fins 102 may be used to increase the distance between the source regions and the drain regions of the fin field-effect transistor so as to increase the length of the current path of the semiconductor structure when the semiconductor structure is in operation, and thus to enhance the voltage withstanding performance of the semiconductor structure.

In one embodiment, the first fins 101, the second fins 102 and the base 100 may be made of a same material, including, for example, single crystal silicon. In some embodiments, the fins may be made of a material different from the material of the semiconductor substrate 100. For example, the fins may be made of one of germanium, silicon germanium, silicon carbide, and gallium nitride, etc.

In one embodiment, the number of the second fins 102 and the number of the first fins 101 are both greater than one. The adjacent first fins 101 may be aligned in parallel; and the adjacent second fins 102 may be aligned in parallel. As shown in FIG. 2, for illustrative purposes, the semiconductor substrate 100 may include three first fins 101 aligned in parallel and three second fins 102 aligned in parallel.

The semiconductor substrate 100, the first fins 101 and the second fins 102 may be formed in a same process. The process for forming the semiconductor substrate 100, the first fins 101 and the second fins 102 may include providing an initial substrate; forming a fin mask layer on the surface of the initial substrate (not shown); etching the initial substrate using the fin mask layer as an etching mask to form the semiconductor substrate 100, the first fins 101 and the second fins 102; and removing the fin mask layer to expose the top surfaces of the first fins 101 and the second fins 102.

The fin mask layer may be used to define the sizes and the locations of the first fins 101 and the second fins 102.

A process for forming the fin mask layer may include forming a mask material layer on the initial substrate; forming a patterned mask layer on the mask material layer; etching the mask material layer using the patterned mask layer as an etching mask to expose the initial substrate. The patterned mask layer may be used to pattern the mask material layer to form the fin mask layer.

In one embodiment, the patterned mask layer may be a patterned photoresist layer; and formed by a spin-coating process and a photolithography process. In some embodiments, the patterned mask layer may be an etching mask formed by a multiple patterning process to reduce the critical dimensions of the fins and the distance between adjacent fins; and enhance the integration level of the formed semiconductor structure. The multiple patterning process for forming the etching mask may include a self-aligned double patterning (SaDP) process, a self-aligned triple patterning (SaTP) process, or a self-aligned double-double patterning (SaDDP) process, etc.

Further, as shown in FIGS. 2-3, a first insulation layer 111 may be formed in the second well region 100n. The first insulation layer 111 may divide the second well region 100n into a first region 101n adjacent to the first well region 100p, a second region 102n away from the first well region 100p and a third region 103n under the first insulation layer 111.

The first insulation layer 111 may be used to increase the distance between the source region and the drain region of the semiconductor structure. Thus, the length of the current path of the semiconductor structure may be increased when the semiconductor structure is in operation. Accordingly, the voltage withstanding performance of the semiconductor structure may be enhanced.

In one embodiment, the semiconductor structure is a fin field-effect transistor (FinFET). The base substrate may include the semiconductor substrate 100, the first fins 101 and the second fins 102. A process for forming the first insulation layer 111 in the second well region 100n may include forming the first insulation layer 111 between the first fins 101 and the second fins 102. The first insulation layer 111 may cover a portion of a side surface of each of the first fins 101 adjacent to the second fins.

In one embodiment, the first insulation layer 111 may also be used for the electrical insulation between the first fins 101 and the second fins 102 adjacent to the first fins 101. A top portion of each side surface of each of the first fins 101 may be exposed by the first insulation layer 111. Thus, the top portions of the side surfaces of the first fins 101 may be covered by the subsequently formed gate structure.

In one embodiment, the first insulation layer 111 is made of silicon oxide. In some embodiments, the first insulation layer may also be made of silicon nitride, silicon oxynitride, a low dielectric constant (K) material (2.5≤K<9), an ultralow low dielectric constant material (K<2.5), or other insulation materials, etc.

A process for forming the first insulation layer 111 may include forming an insulation material layer on the semiconductor substrate 100 exposed by the first fins 101 and the second fins 102. The insulation material layer may also cover the top surfaces of the first fins 101 and the top surfaces of the second fins 102. Then, the insulation material layer may be etched back to form the first insulation layer 111.

As shown in FIG. 2 and FIG. 3, in one embodiment, the number of the second fins 102 is greater one. During the process for forming the first insulation layer 111, a second insulation layer 112 may be formed between the adjacent second fins 102. The top of the second insulation layer 112 may above the top surfaces of the second fins 102 and cover a portion of the top surface of each of the second fins 102.

The second insulation layer 112 may be used for an electrical insulation between the adjacent second fins 102.

In one embodiment, the plurality of second fins 102 may be aligned in parallel along a direction perpendicular to the length direction of one of the second fins 102. The second insulation layer 112 may be between the adjacent second fins 102 along the direction perpendicular to the length direction of the second fin 102. The electrical insulation between the adjacent second fins 102 along the direction perpendicular to the length direction of the second fin 102 may be obtained.

Further, as shown in FIG. 3, the second insulation layer 112 may also cover portions of the top surfaces of the second fins 102. A first mask gate structure may be subsequently formed on the second insulation layer 112. Thus, the second insulation layer 112 may also be used to improve the electrical insulation between the first mask gate structure and the second fins 102 to reduce the leakage current.

The second insulation layer 112 and the first insulation layer 111 may be both formed by etching the insulation material layer. Thus, the second insulation layer 112 and the first insulation layer 111 may be made of a same material. In one embodiment, the second insulation layer 112 is made of silicon oxide.

The etch-back process may include performing a first etch-back process to the insulation material layer to reduce the thickness of the insulation material layer formed on the second fins 102; and forming an insulation mask layer on the processed insulation material layer. The insulation mask layer may be formed on the portions of the second fins 102 adjacent to the first fins 101. Further, the process may also include performing a second etch-back process on the remaining insulation material layer using the insulation mask layer as an etching mask. Thus, the first insulation layer 111 and the second insulation layer 112 under the insulation mask layer may be formed.

The thickness of the insulation material layer on the first fins 101 and the second fins 102 may be sufficiently large to ensure the filling effect of the insulation material layer. Thus, the first etch-back process may remove a portion of the insulation material layer on the second fins 102 to reduce its thickness.

The first back etching may reduce the thickness of the insulation material layer on the second fins 102. However, the second insulation layer 112 may still cover portions of the top surfaces of the second fins 102.

The thickness of the insulation layer 112 on the second fins 102 may be in an appropriate range. If the thickness of the insulation layer 112 on the second fins 102 is too small, the electrical insulation of the second fins 102 may be affected. Accordingly, the performance of the formed semiconductor structure may be affected. If the thickness of the insulation layer 112 on the second fins 102 is too large, it may be a waste of material; and may also increase the difficulty in the fabrication process. In one embodiment, the thickness of the second insulation layer 112 on the second fins 102 may be in a range of approximately 30 nm-60 nm.

The insulation mask layer may be used to protect the portion of the insulation material layer to define the size and the location of the second insulation layer 112. The insulation mask layer may be a photoresist layer; and may be formed on the second fins 102 by a coating process and a photolithography process.

In one embodiment, the insulation mask layer may also be formed on the portion of the insulation material layer between the second fins 102 and the first fins 101. Thus, the formed second insulation layer 112 may cover not only portions of the top surfaces of the second fins 102, but also the side surfaces of the second fins 102 facing the first fins 102. Such a geometry of the second insulation layer 102 may increase the process window for forming the second insulation layer 112; and reduce the difficulty of the fabrication process.

The second etch-back process may be used to remove the portion of the remaining insulation material layer; and to form the first insulation layer 111 and the second insulation layer 112. The second etch-back process may allow the formed first insulation layer 111 to expose the top portions of the side surfaces of the first fins 101. Thus, the top portions of the side surfaces of the first fins 101 may be covered by the subsequently formed gate structure.

The first etch-back process and the second etch-back process may be any appropriate process. In one embodiment, the first back etching and/or the second back etching may be a dry etching process.

Figure 4:
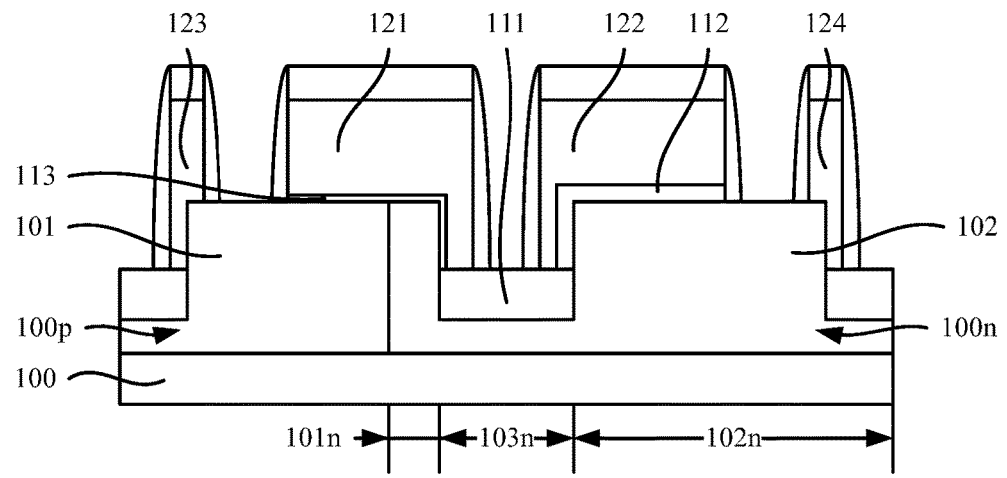

Returning to FIG. 11, after providing the base substrate with the certain structures, a gate structure and a mask gate structure may be formed (S102). FIG. 4 illustrates a corresponding semiconductor structure. FIG. 4 is the cross-sectional view of a semiconductor structure based on the semiconductor structure illustrated in FIG. 3.

As shown in FIG. 4, a gate structure 121 is formed on the first well region 100p; and a first mask gate structure 122 is formed on the second well region 100n. The gate structure 121 may also be formed on the first region 101n of the second well region 100n. The first mask structure 122 may be formed on a portion of the second region 102n adjacent to the first region 101n.

In some embodiments, a plurality of doped source regions may be subsequently formed in the first well region adjacent to the gate structure, while a plurality of doped drain regions may be subsequently formed in the second well region adjacent to the first mask gate structure. In other embodiments, a plurality of doped drain regions may be subsequently formed in the first well region adjacent to the gate structure, while a plurality of doped source regions may be subsequently formed in the second well region adjacent to the first mask gate structure.

For illustration purposes, the present disclosure is described, as an example, having source regions in the first well region 100p, and having drain regions in the second well region 100n.

The gate structure 121 may be used to cover a portion of the first well region 100p to define the locations of the subsequently formed doped source regions in the first well region 100p.

Because the gate structure 121 may also be formed on the first region 101n of the second well region 100n, a portion of the first well region 100p away from the second well region 100n may be exposed by the gate structure 121. Thus, the doped source regions may be subsequently formed in the first well region 100p at the side of the gate structure 121 away from the second well region 100n.

The first mask gate structure 122 may be used to cover a portion of the second well region 100n adjacent to the first well region 100p. Thus, the locations of the doped drain regions subsequently formed in the second well region 100n may be defined.

Because the first mask gate structure 122 may be formed on a portion of the second region 102n adjacent to the first region 101n, a portion of the second region 102n away from the first region 101n may be exposed by the first mask gate structure 122. Thus, doped drain regions may be subsequently formed in the second region 102n at the side of the first mask gate structure 122 away from the first well region 100p.

Because the first mask gate structure 122 may cover a portion of the second region 102n adjacent to the first region 101n, the doped source/drain regions may be subsequently formed in the portions of the second region 102n away from the first region 101n. Accordingly, the distance between the doped drain regions in the second well region 100n and the doped source regions in the first well region 100p may be efficiently increased. Thus, the distance between the source regions and the drain regions of the semiconductor structure may be further increased; and the length of the current paths of the semiconductor structure may be increased when the semiconductor structure is in operation. Accordingly, the voltage withstanding performance of the semiconductor structure may be enhanced.

In one embodiment, during the process for forming the first mask structure 122, the first mask structure 122 may also be formed on a portion of the first insulation layer 111. That is, the first mask structure 122 may be formed on a portion of the second region 102n of the second well region 100n and a portion of the first insulation layer 111. Disposing the first mask structure 122 in such a way may be able to enlarge the process window for forming the first mask structure 122; reduce the difficulty of the fabrication process; improve the yield; and enhance the performance of the semiconductor structure.

The semiconductor structure may be a fin field-effect transistor (FinFET). The base substrate may include the semiconductor substrate 100, the first fins 101 and the second fins 102. Thus, a process for forming the gate structure 121 and the first mask gate structure 122 may include forming the gate structure 121 on the first fins 101 and the first mask gate structure 122 on the second fins 102. The gate structure 121 may be across the first fins 101 and on portions of the top surfaces and top portions of the side surfaces of the first fins 101. The first mask gate structure 122 may be formed on the second fins 102.

The semiconductor structure may also include a second insulation layer 112 between adjacent second fins 102. Thus, the second insulation layer 112 may also cover portions of the top surfaces of the second fins 102. Accordingly, the process forming the first mask gate structure 122 may also include forming the first mask gate structure 122 on the second mask layer 112.

Specifically, the second mask layer 112 may cover portions of the top surfaces of the second fins 102 and the top portions of the side surfaces of the second fins 102 facing the first fins 101. Therefore, the first mask gate structure 122 may be formed on the portions of the top surfaces of the second fins 102 and the top portions of the side surfaces of the second fins 102 facing the first fins 101.

In one embodiment, the second insulation layer 112 may be formed between the adjacent second fins 102, and the second insulation layer 112 may cover portions of the top surfaces of the second fins 102. Thus, the first mask gate structure 122 may only be formed on the second fins 102; and may not be across the second fins 102 and may not cover the side surfaces of the second fins 102. The covered area between the first mask structure 122 and the second fins 102 may be reduced. Thus, the electricity insulation performance between the first mask gate structure 122 and the second fins 102 may be efficiently enhanced. Accordingly, the occurrence of a leakage current in the first mask gate structure 122 may be reduced; and the performance of the semiconductor structure may be improved.

Further, the second insulation layer 112 may also be formed on the side surfaces of the second fins 102 facing the first fins 101. That is, the electrical insulation between the first mask gate structure 122 and the side surfaces of the second fins 102 facing the first fins 101 may be fulfilled by the second insulation layer 112.

In one embodiment, the gate structure 121 is a dummy structure. The gate structure 121 may also be used to reserve the space for subsequently forming a gate structure. In some embodiment, the gate structure may be a metal gate structure, etc.

Further, the gate structure 121 and the first mask gate structure 122 may be made of a same material to simplify the fabrication process, and to reduce the cost. In some embodiments, the first mask gate structure and the gate structure may be made of different materials.

The gate structure 121 may be a single layer structure, including a first dummy gate layer. The first mask gate structure 122 may include a first dummy mask gate layer. The dummy gate layer and the first dummy mask gate layer may be both made of polysilicon.

Using polysilicon to form the gate structure 121 and the first mask gate structure 122 may reduce the difficulty of the fabrication process; and improve the yield. Further, polysilicon is widely used as the material of the gate layer, the process compatibility may be increased.

In some embodiments, the dummy gate layer may also be made of silicon oxide, silicon nitride, silicon oxynitride, silicon carbide, or amorphous silicon, etc. Accordingly, the first dummy mask gate layer may also be made of silicon oxide, silicon nitride, silicon oxynitride, silicon carbide, or amorphous silicon, etc.

Further, in some embodiments, the dummy structure may be a multiple layer stacked structure. That is, the gate structure 121 may be a multiple layer stacked structure, including a dummy oxide layer and a dummy gate layer on the dummy oxide layer. The dummy oxide layer may be made of silicon oxide, or silicon oxynitride, etc. Accordingly, the first dummy mask gate layer may have a structure similar to that of the dummy gate structure.

Because the gate structure 121 and the first mask gate structure 122 are made of a same material, for example, polysilicon, the gate structure 121 and the first mask gate structure 122 may be formed by a same process.

Specifically, a process for forming the gate structure 121 and the first mask gate structure 122 may include forming a gate material layer over the base substrate; forming a gate mask layer (not shown) on the gate material layer; and etching the gate material layer using the gate mask layer as an etching mask to form the gate structure 121 and the first mask gate structure 122.

The gate material layer may be used to form the gate structure 121 and the first mask gate structure 122. The gate material layer may be a polysilicon layer.

The gate mask layer may be used to define the sizes and the locations of the gate structure 121 and the first mask gate structure 122. Further, in one embodiment, the gate mask layer may also be used to an etching stop layer of the subsequent etching process. The gate mask layer may be made of silicon nitride, etc.

After the forming the gate structure 121 and the first mask gate structure 122, sidewall spacers (not shown) may be formed on the side surfaces of the gate structure 121 and the side surfaces of the first mask gate structure 122. The sidewall spacers may be made of silicon oxide, silicon nitride, silicon carbide, silicon carbonitride, silicon oxycarbonitride, silicon oxynitride, boron nitride, or boron oxynitride, etc. The sidewall spacers may be a single layer structure or a multiple layer stacked structure. In one embodiment, the sidewall spacers are a single layer structure; and are made of silicon nitride.

Further, in one embodiment, after forming the first insulation layer 111 and before forming the gate structure 121, an oxide layer 113 may be formed on the first fins 101. The thickness of the oxide layer 113 may be smaller than the thickness of the second insulation layer 112 on the second fins 102. That is, the thickness of the second insulation layer 112 between the first mask gate structure 122 and the top surfaces of the second fins 102 may be greater than the thickness of the oxide layer 113. Such a configuration may efficiently enhance the electrical insulation performance between the first mask gate structure 122 and the second fins 102. Thus, the occurrence of the leakage current in the first mask gate structure 122 may be reduced; and the performance of the semiconductor structure may be improved.

The oxide layer 113 may be an interfacial layer to improve the interface performance between the first fins 102 and the subsequent formed layer. The oxide layer 113 may also be a protection layer to protect the first fins 101 during the process for forming the semiconductor structure. The function of the oxide layer 113 may not be limited in the present disclosure. The oxide layer 113 may be formed by any approximate process, such as an in situ water vapor annealing process, a chemical vapor deposition (CVD) process, a physical vapor deposition (PVD) process, an atomic layer deposition (ALD) process, or a furnace oxidation process, etc.

Figure 5:
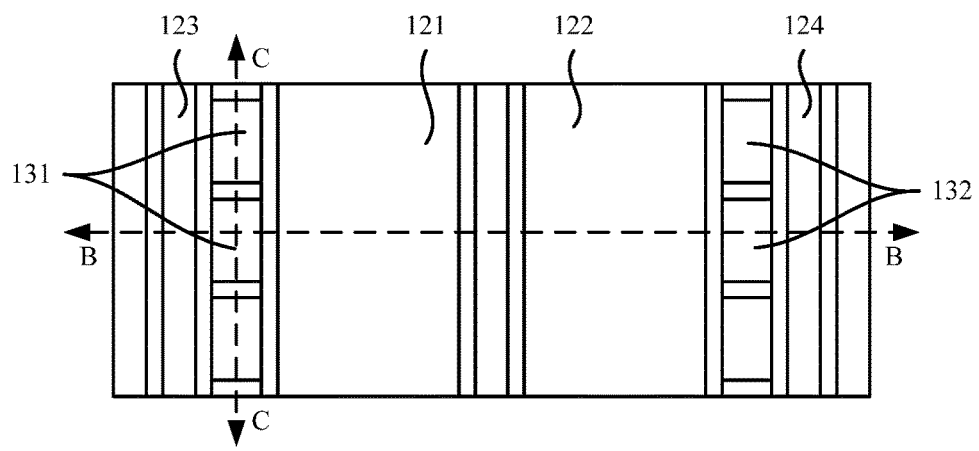
Figure 6:
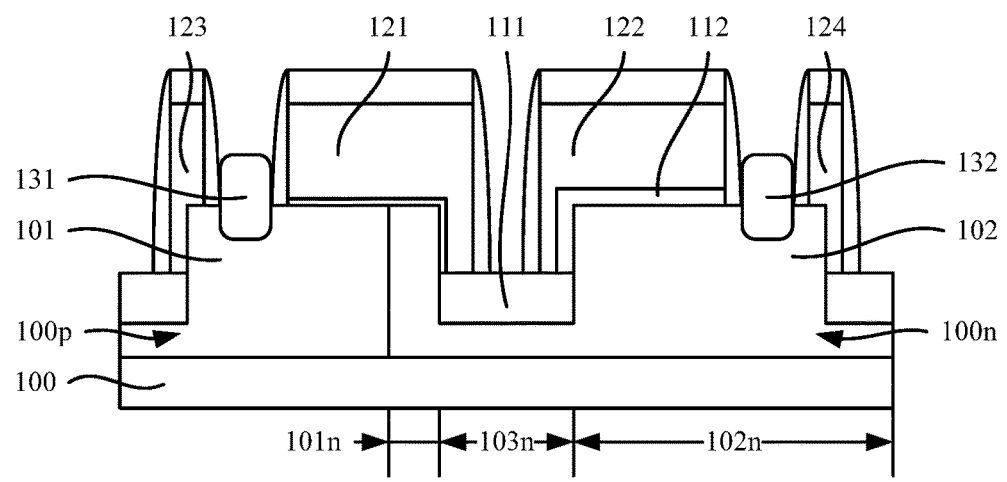
Figure 7:
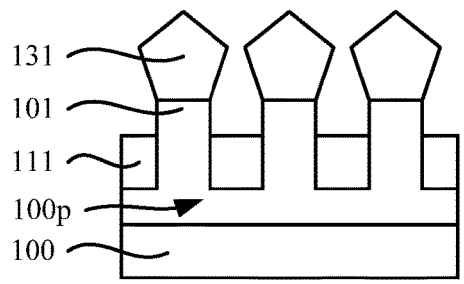

Returning to FIG. 11, after forming the gate structure and the mask gate structure, doped source regions and doped drain regions may be formed (S103). FIGS. 5-6 illustrate a corresponding semiconductor structure. FIG. 6 is the cross-sectional view of the semiconductor structure illustrated in FIG. 5 along the "BB" direction. FIG. 7 is the cross-sectional view of the semiconductor structure illustrated in FIG. 5 along the "CC" direction.

As shown in FIGS. 5-7, doped source/drain regions (not labeled) may be formed in the first well region 100p exposed by the gate structure 121 and the second region 102n of the second well region 100n exposed by the first mask gate structure 122.

For illustrative purposes, the present disclosure is described, as an example, having source regions in the first well region 100p, and having drain regions in the second well region 100n. In some embodiments, the drain regions may be formed in the first well region; and the source regions may be formed in the second well region.

The doped source regions and the doped drain regions may be used as the source regions and the drain regions of the semiconductor structure, respectively.

In one embodiment, the first well region 100p may be a lateral diffusion region and the second well region 100n may be a drift region. Therefore, the doped source regions in the first well region 100p may used to form the source regions of the semiconductor structure, and the doped drain regions in the second well region 100n may be used as the drain regions of the semiconductor structure.

Since the gate structure 121 may be formed on the first well region 100p and the first region 101n of the second region 100n, the gate structure 121 may cover the portion of the first well region 100p adjacent to the second well region 100n, and a portion of the first well region 100p away from the first well region 100p may be exposed. The doped source regions in the first well region 100p may be thus in the first well region 100p at one side of the gate structure 121 away from the second well region 100n.

The first mask gate structure 122 may be on a portion of the second region 102n adjacent to the first region 101n, the first mask gate structure 122 may cover a portion of the second region 102n of the second well region 100n adjacent to the first well region 100p. Thus, the doped drain regions may be thus in the second region 102n at one side of the first mask gate structure 122 far away from the first well region 100p.

Therefore, the distance between the doped drain regions in the second well region 100n and the doped source regions in the first well region 100p may be sufficiently large. That is, the distance between the source regions and the drain regions of the formed semiconductor structure may be sufficiently large. Thus, the length of the current paths of the semiconductor structure may be increased when the semiconductor structure is in operation; and the voltage withstanding performance of the semiconductor structure may be enhanced.

A process for forming the doped source regions and the doped drain regions may include forming a first stress layer 131. In one embodiment, the first stress layer 131 may be formed in the first well region 100p exposed by the gate structure 121. The process may also include forming a second stress layer 132 in the second well region 100n. The second stress layer 132 may be formed in the second region 102n of the second well region 100n exposed by the first mask gate structure 122.

The first stress layer 131 may be used to form the doped source regions in the first well region 100p. The second stress layer 132 may be used to form the doped drain regions in the second well region 100n.

In one embodiment, the semiconductor structure is an N-type fin field-effect transistor (FinFET). The first stress layer 131 and the second stress layer 132 may be made of N-type doped Si, or SiC, etc. The first stress layer 131 and the second stress layer 132 be formed in the first fins 101 and the second fins 102 by an epitaxial growth process. During the process for forming the first stress layer 131 and the second stress layer 132 by the epitaxial growth process, the first stress layer 131 and the second stress layer 132 may be in situ doped.

To improve the quality of the first stress layer 131 and the second stress layer 132, and the performance of the formed semiconductor structure, in one embodiment, the process may also include forming a second mask gate structure 123 on the first well region 100p and a third mask gate structure 124 on the second region 102n of the second well region 100n before forming the doped source regions and the doped drain regions and after forming the first insulation layer 111. There may be a gap between the second mask gate structure 123 and the gate structure 121; and the gap may be at the side of the gate structure 121 away from the first insulation layer 111. There may be a gap between the third mask gate structure 124 and the first mask gate structure 122; and the gap may be at the side of the first mask gate structure 122 away from the first insulation layer 111.

The second mask gate structure 123, along with the gate structure 121, may be used to define the size and the location of the first stress layer 131. The third mask gate structure 124, along with the first mask gate structure 122, may be used to define the size and the location of the second stress layer 132.

A process for forming the first stress layer 131 may include forming the first stress layer 131 between the second mask gate structure 123 and the gate structure 121. A process for forming the second stress layer 132 may include forming the second stress layer 132 between the third mask gate structure 124 and the first mask gate structure 122.

In one embodiment, the second mask gate structure 123 and the third mask gate structure 124 may be made of a same material as the first mask gate structure 122. That is, the second mask gate structure 123, the third mask gate structure 124 and the first mask gate structure 122 may be made of a same material as the gate structure 121. In some embodiments, the second mask gate structure and the third mask gate structure may be made of a material different from that of the first mask gate structure.

Therefore, the second mask gate structure 123, the third mask gate structure 124, the first mask gate structure 122 and the first gate structure 121 may be formed by a same process to simplify the fabrication process, and reduce the cost. Thus, the fabrication process of the second mask gate structure 123 and the third mask gate structure 124 may be referred to the fabrication process of the gate structure 121 and the first mask gate structure 122.

Further, as shown in FIG. 6, the second mask gate structure 123 may also be formed on the side surfaces of the first fins 101 away from the first insulation layer 111. The third mask gate structure 124 may also be formed on the side surfaces of the second fins 102 away from the first insulation layer 111. Such configurations of the second mask gate structure 123 and the third mask gate structure 124 may be able to enlarge the process window for forming the second mask gate structure 123 and the third mask gate structure 124; and the difficulty of the fabrication process may be reduced.

Figure 8:
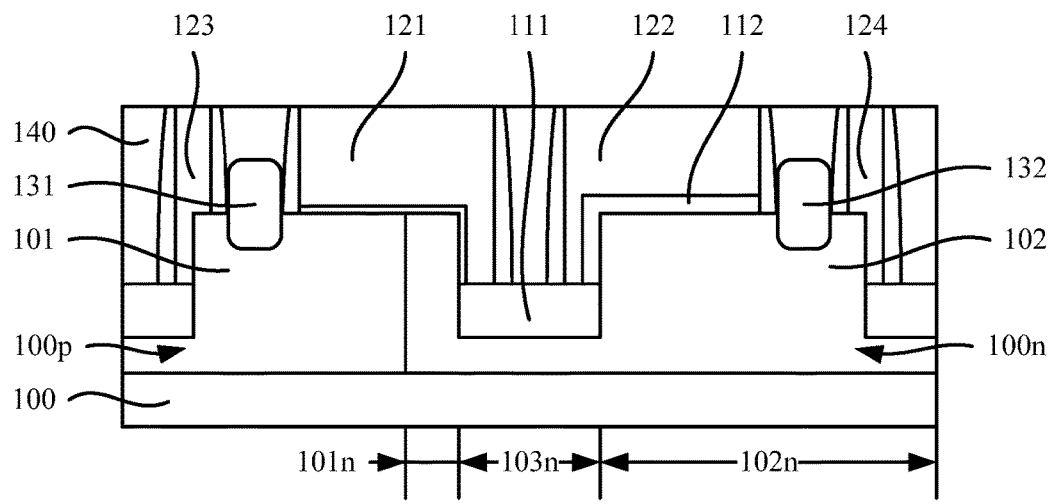

Returning to FIG. 11, after forming the doped source regions and the doped drain regions, a dielectric layer may be formed (S104). FIG. 8 illustrate a corresponding semiconductor structure.

In one embodiment, the gate structure is a dummy gate structure. As shown in FIG. 8, a dielectric layer 140 is formed on the base substrate exposed by the gate structure 121 after forming the doped source regions and the doped drain regions.

The dielectric layer 140 may be an interlayer dielectric layer for the electrical insulation between semiconductor structures. The dielectric layer 140 may also be used to define the size and the location of the subsequently formed gate structure.

In one embodiment, the dielectric layer 140 is made of silicon oxide. In some embodiments, the dielectric layer may also be made of silicon nitride, silicon oxynitride, or silicon oxycarbonitride, etc.

In one embodiment, the first mask gate structure 122, the second mask gate structure 123 and the third mask gate structure 124 may also be formed on the base substrate. Thus, the dielectric layer 140 may be formed on the base substrate exposed by the gate structure 121, the first mask gate structure 122, the second mask gate structure 123 and the third mask gate structure 124.

Since the gate structure 121, the first mask gate structure 122, the second mask gate structure 123 and the third mask gate structure 124 may be formed by a same fabrication process, the first mask gate structure 122, the second mask gate structure 123 and the third mask gate structure 124 may also be exposed by the dielectric layer 140.

A process for forming the dielectric layer 140 may include forming a dielectric material layer on the base substrate exposed by the gate structure 121, the first mask gate structure 122, the second mask gate structure 123 and the third mask gate structure 124 by a chemical vapor deposition (CVD) process (for example, a flowable chemical vapor deposition process, FCVD), or other appropriate processes. The dielectric material layer may cover the gate structure 121, the first mask gate structure 122, the second mask gate structure 123 and the third mask gate structure 124. The process may also include removing the dielectric material layer above the gate structure 121, the first mask gate structure 122, the second mask gate structure 123 and the third mask gate structure 124 by a chemical mechanical polishing (CMP) process, or other appropriate processes to expose the gate structure 121, the first mask gate structure 122, the second mask gate structure 123 and the third mask gate structure 124. Thus, the dielectric layer 140 may be formed.

During the process for removing the dielectric material layer above the gate structure 121, the first mask gate structure 122, the second mask gate structure 123 and the third mask gate structure 124, the gate mask layer (not labeled) may be used as a stop layer for the CMP process. Further, after removing the dielectric material layer above the gate structure 121, the first mask gate structure 122, the second mask gate structure 123 and the third mask gate structure 124, the gate mask layer may be removed to expose the top surfaces of the gate structure 121, the first mask gate structure 122, the second mask gate structure 123 and the third mask gate structure 124.

Returning to FIG. 11, after forming the dielectric layer, a gate opening may be formed (105). FIG. 9 illustrates a corresponding semiconductor structure.

As shown in FIG. 9, the gate structure 121 is removed; and a gate opening 151 may be formed. The removal of the gate structure 121 (as shown in FIG. 8) to form the gate opening 151 may provide a process space for subsequently forming a metal gate structure.

The gate structure 121 may include a dummy gate layer. The process for forming the gate opening 151 may include removing the dummy gate layer to form the gate opening 151.

In one embodiment, the first mask gate structure 122 and the gate structure 121 are made of the same material. The first mask gate structure 122 may include the first dummy mask gate layer. During the process for removing the gate structure 121 to form the gate opening 151, the first dummy mask gate layer may also be removed; and a first mask gate opening 152 may be formed. The removal of the dummy gate layer and the first dummy mask gate layer may be performed in a same process. Thus, the use of the etching mask may be reduced; and the production cost may be reduced.

Similarly, since the second mask gate structure 123 and the third mask gate structure 124 may be made of the same material as the first mask gate structure 122, the second mask gate structure 123 may include the second dummy mask gate layer; and the third mask gate structure 124 may include the third dummy mask gate layer, the process for forming the gate opening 151 and the first mask gate opening 152 may also include removing the second dummy mask gate layer to form a second mask gate opening 153. Further, the process may include removing the third dummy mask gate layer to form a third mask gate opening 154. Similarly, the removal of the dummy gate layer, the first dummy mask gate layer, the second dummy mask gate layer and the third dummy mask gate layer may be performed in a same process. Thus, the use of the etching mask may be reduced. Accordingly, the production cost may be reduced.

Returning to FIG. 11, after forming the gate opening, a metal gate structure may be formed (S106). FIG. 10 illustrates a corresponding semiconductor structure.

As shown in FIG. 10, a metal gate structure 161 is formed in the gate opening 151. The metal gate structure 161 may be used to control the "on/off" of the channels of the semiconductor structure.

Since the first mask gate opening 152 may also be formed in the dielectric layer 140, the process may also include forming a first metal mask gate structure 162 in the first mask gate opening 152 during the process for forming the metal mask gate structure 161.

Further, the second mask gate opening 153 and the third mask gate opening 154 may also be formed in the dielectric layer 140. Therefore, a second metal mask gate structure 163 may be formed in the second mask gate opening 153; and a third metal mask gate structure 164 may be formed in the third mask gate opening 154 during the process for forming the metal gate structure 161 and the first gate mask gate structure 162.

The metal gate structure 161 may include a metal material in the gate opening 151 (as shown in FIG. 9), and a work function layer and a gate dielectric layer between the metal material and the base substrate.

The structure and the material of the first metal mask gate structure 162 may be the same as the structure and the material of the metal gate structure 161. The first mask gate structure 162 may include the metal material in the first mask gate opening 152 (as shown in FIG. 9), and the work function layer and the gate dielectric layer between the metal material and the base substrate.

The structures and the materials of the second metal mask gate structure 163 and the third metal mask gate structure 164 may be the same as those of the first mask gate structure 162. Thus, the second metal mask gate structure 163 may include the metal material in the second mask gate opening 153 (as shown in FIG. 9), and the work function layer and the gate dielectric layer between the metal material and the base substrate. The third metal mask gate structure 164 may include the metal material in the third mask gate opening 154 (as shown in FIG. 9), and the work function layer and the gate dielectric layer between the metal material and the base substrate.

A process for forming the metal gate structure 161 may include forming a gate dielectric layer (not shown) in the gate opening 161 (as shown in FIG. 9). The process may also include forming the work function layer on the gate dielectric layer; and forming the metal gate structure 161 by filling the metal material into the gate opening 151 after forming the work function layer.

The gate dielectric layer may be used for the electrical insulation between the gate structure and the base substrate.

The gate dielectric layer may be made of any appropriate high dielectric constant (high-K) material with a relative dielectric constant greater than the relative dielectric constant of silicon oxide, such as one or more than one of HfO, ZrO, LaO, AlO, TiO, HfSiO, SrTiO, ZrSiO, LaAlO, YO, HfON, LaON, AlON, TiON, SrTiON, LaAlON, or YON, etc.

In one embodiment, the gate dielectric layer may be not only on the bottom of gate opening 151 but also on the side surfaces of the gate opening 151. Because the first mask gate opening 152 may also be formed in the dielectric layer 140, the gate dielectric layer may also be on the bottom of the first mask gate opening 142 and the side surfaces of the first mask gate opening 152.

Further, the second mask gate opening 153 and the third mask gate opening 154 may also be formed in the dielectric layer 140. Therefore, the gate dielectric layer may also be on the bottom of the second mask gate opening 153 and the side surfaces of the second mask gate opening 153, as well as the bottom of the third mask gate opening 154 and the side surfaces of the third mask gate opening 154.

The work function layer may be used to adjust the work function of the formed metal gate structure to adjust the threshold voltage. According to the type of the semiconductor structure, the work function layer may be made of TiN, or TiAl, etc.

The work function layer may be formed on the gate dielectric layer. Therefore, the work function layer may be formed on the gate dielectric layer on both the bottom surface and the side surfaces of the gate opening 151. Further, the work function layer may also be formed on the gate dielectric layer on both the bottom surface and the side surfaces of the first mask gate opening 152. Further, the work function layer may also be formed on the gate dielectric layer on both the bottom surfaces and the side surfaces of the second mask gate opening 153, and on the gate dielectric layer on both the bottom surface and the side surfaces of the third mask gate opening 154.

The metal material may be used to form the gate electrode.

In one embodiment, the metal material is W. The process for filling the metal material may include filling the metal material into the gate opening 151. The metal material may cover the dielectric layer 140. Further, the process may also include planarizing the metal material to expose the dielectric layer 140; and the metal gate structure 161 may be formed.

In one embodiment, since the first mask gate opening 152 may also be formed in the dielectric layer 140, the metal material may also be filled into the first mask gate opening 152 to form the first metal mask gate structure 162.

Further, the second mask gate opening 153 and the third mask gate opening 154 may also be formed in the dielectric layer 140. Thus, the metal material may also be filled into the second mask gate opening 153 to form the second metal mask gate structure 163, and the third mask gate opening 154 to form the third metal mask gate structure 164.

Accordingly, the present disclosure also provides a semiconductor structure. FIG. 10 illustrates a corresponding semiconductor structure consistent with various disclosed embodiments.

As shown in FIG. 10, the semiconductor structure includes a base substrate. The base substrate may include a first well region 100p and a second well region 100n adjacent to the first well region 100p. The first well region 100p may have a first type of doping ions and the second well region 100n may have a second type of doping ions. The semiconductor structure may also include a first insulation layer 111 in the second well region 100n. The first insulation layer 111 may divide the second well region 100n into a first region 101n adjacent to the first well region 100p, and a second region 102n away from the first well region 100p, and a third region 103n under the first insulation structure 111. Further, the semiconductor structure may include a gate structure 161 on the first well region 100p and the first region 101n of the second well region 100n. Further, the semiconductor structure may also include a first mask gate structure 162 on the second well region 100n and a portion of the second region 102n adjacent to the first region 100p. Further semiconductor structure may also include doped source regions 131 in the first well region 100p and doped drain regions 132 in the second well regions 100n. The doped source regions may be in the first well region 100p exposed by the gate structure 161. The doped drain regions may be in the second region 102n of the second well region 100n exposed by the first mask gate structure 162.

The base substrate may include the first well region 100p and the second well region 100n adjacent to the first well region 100p. The first well region 100p may be doped with the first type of doping ions; and the second well region 100n may be doped with the second type of doping ions.

The base substrate provides a process platform. The first well region 100p may be used as a lateral diffusion region to form the channels with a concentration gradient. The second well region 100n may be used as a drift region to withstand a higher divided voltage.

In one embodiment, the first well region 100p may be a P-type well region. That is, the first type of doping ions may be P-type ions, such as boron ions, gallium ions, or indium ions, etc. The second well region 100n may be an N-type well region. That is, the second type of doping ions may be N-type ions, such as phosphide ions, arsenic ions, or antimony ions, etc.

In one embodiment, the semiconductor structure is a fin field-effect transistor (FinFET). The base substrate may include a semiconductor substrate 100, a plurality of first fins 101 and a plurality of second fins 102 on the semiconductor substrate 100. The first fins 101 and the second fins 102 may be distributed along the length direction of one of the fins on the base substrate 100. The first well region 100p and the second well region 100n may be in the first fins 101, and distributed sequentially along a direction from the first fins 101 to the second fins 102. The second well region 100n may extend into the second fins 102.

The semiconductor substrate 100 provides a process platform.

In one embodiment, the semiconductor substrate 100 is made of single crystal silicon. In some embodiments, the semiconductor substrate may also be made of polysilicon, amorphous silicon, silicon germanium, silicon carbide, silicon on insulator (SOI), gallium on insulator (GOI), glass, or group III-V compound, such as gallium nitride, or gallium arsenide, etc. The material of the semiconductor substrate 100 may be selected to meet the requirements of the process integration.

The first fins 101 may be used to provide the channels of the fin field-effect transistor. The second fins 102 may be used to extend the distance between the doped source regions and the doped drain regions of the fin field-effect transistor so as to increase the length of the current path when the semiconductor structure is in operation. Accordingly, the voltage withstanding performance of the semiconductor structure may be enhanced.

In one embodiment, the first fins 101, the second fins 102 and the semiconductor substrate 100 are made of a same material, for example, single crystal silicon. In some embodiments, the fins may be made of a material different from the semiconductor substrate. For example, the fins may be made of germanium, silicon germanium, silicon carbide, or gallium nitride, etc.

The number of the second fins 102 and the first fins 101 may be greater than one. The adjacent first fins 101 may be distributed in parallel. The adjacent second fins 102 may be distributed in parallel as well. As shown in FIG. 2, for illustrative purposes, the base substrate may include three first fins 101 distributed in parallel and three second fins 102 distributed in parallel.

The first insulation layer 111 may be used to further increase the distance between the source regions and the drain regions of the semiconductor structure so as to increase the length of the current path of the semiconductor structure when semiconductor is in operation. Accordingly, the voltage withstanding performance of the semiconductor structure may be enhanced.

In one embodiment, the semiconductor structure is a fin field-effect transistor. The base substrate may include the semiconductor substrate 100, the first fins 101 and the second fins 102. A first insulation layer 111 may be formed between the first fins 101 and the second fins 102. The first insulation layer 111 may cover portions of the side surfaces of the first fins 101 and the second fins 102.

In one embodiment, the first insulation layer 111 may also be used for the electrical insulation between the first fins 101 and the second fins 102. The top portions of the side surfaces of the first fins 101 may be exposed by the first insulation layer 111. Therefore, the top portions of the side surfaces of the first fins 101 may be covered by the subsequently formed gate structure.

In one embodiment, the first insulation layer 111 is made of silicon oxide. In some embodiments, the first insulation layer 111 may also be made of silicon nitride, silicon oxynitride, low dielectric constant material (2.5≤K<3.9), ultra-low dielectric constant material (K<2.5), or other insulation material.

The semiconductor structure may also include a second insulation layer 112 among the adjacent second fins 102. The top surface of the second insulation layer 112 may be above the top surfaces of the second fins 102; and may cover portions of the top surfaces of the second fins 102.

The second insulation layer 112 may be used for the electrical insulation among the adjacent second fins 102.

In one embodiment, the plurality of second fins 102 may be distributed in parallel along the direction of perpendicular to the length direction of the second fins 102. The second insulation layer 112 may be between adjacent second fins 102 along the direction perpendicular to the length direction of the second fins 102. Thus, the electrical insulation between adjacent second fins 102 along the direction perpendicular to the length direction of the second fins 102 may be obtained.

In one embodiment, the second insulation layer 112 and the first insulation layer 111 are made of a same material. Thus, the second insulation layer 112 may be made of silicon oxide.

Further, as shown in FIG. 10, the second insulation layer 112 may also cover portions of the top surfaces of the second fins 102. The first mask gate structure 162 may be subsequently formed on the second insulation layer 112. Therefore, the second insulation layer 112 may also be used to improve the electrical insulation between the first mask gate structure 162 and the second fins 102; and to reduce the occurrence of the leakage current.

In one embodiment, the semiconductor structure may also include an oxide layer 113 between the gate structure 161 and the first fins 101. The thickness of the oxide layer 113 may be smaller than the thickness of the second insulation layer 112 on the second fins 102.

The oxide layer 113 may be an interfacial layer to improve the interface performance between the first fins 102 and the subsequent formed layers. The oxide layer 113 may also be a protection layer to protect the first fins 101 during the fabrication processes.

The thicknesses of the second insulation layer 112 on the second fins 102 may be an appropriate value. If the second insulation layer 112 is too thin, the electrical insulation of the second fins 102 may be affected as well as the performance of the formed semiconductor structure. If the second insulation layer 112 is too thick, it may be a waste of material, and the difficulty in the fabrication process may also be increased. In one embodiment, the thickness of the second insulation layer 112 on the second fins 102 may be in a range of approximately 30 nm-60 nm.

The second insulation layer 112 may cover not only portions of the top surfaces of the second fins 102 but also the side surfaces of the second fins 102 facing the first fins 102. Such a configuration of the second insulation layer 102 may be able to increase the process window for forming the second insulation layer 112, and reduce the process difficulty.

The gate structure 161 may be used to cover a portion of the first well region 100p to define the location of the doped source regions in the first well region 100p. The gate structure 161 may also be used to control the "on/off" of the channels of the semiconductor structure.

Because the gate structure 161 may also be formed on the first region 101n of the second well region 100n, a portion of the first well region 100p away from the second well region 100n may be exposed by the gate structure 161.

The semiconductor structure may be a fin field-effect transistor. The base substrate may include the substrate 100, the first fins 101 and the second fins 102. The gate structure 161 may be formed on the first fins 101 and across the first fins 101. Further, the gate structure 161 may also be on portions of the top surfaces and the top portions of the side surfaces of the first fins 101.

In one embodiment, the gate structure 161 is a metal gate structure 161.

The metal gate structure 161 may include a gate dielectric layer on a portion of the first well region 100p and the first region 101n of the second well region 100n, a work function layer on the gate dielectric layer, and a metal material layer on the work function layer.

The gate dielectric layer may be used for the electrical insulation between the gate structure and the base substrate.

The gate dielectric layer may be made of any appropriate high dielectric constant (high-K) material with a dielectric constant greater than the dielectric constant of silicon oxide, such as one or more of HfO, ZrO, LaO, AlO, TiO, HfSiO, SrTiO, ZrSiO, LaAlO, YO, HfON, LaON, AlON, TiON, SrTiON, LaAlON, or YON, etc.

The work function layer may be used to adjust the work function of the metal gate structure; and the threshold voltage of the semiconductor structure may be adjusted. According to the type of the semiconductor structure, the work function layer may be made of TiN, or TiAl, etc.

The metal material may be used to form the gate electrode. In one embodiment, the metal material is tungsten.

In one embodiment, the work function layer and the gate dielectric layer may also be on the side surfaces of the metal material.

Further, in some embodiments, the gate structure may be a dummy gate structure. When the gate structure is a dummy gate structure, the dummy gate structure may be a single layer structure, including the dummy gate layer. The dummy gate layer may be made of polysilicon.

When the gate structure is made of polysilicon. The fabrication difficulty may be reduced; and the yield may be improved. Further, polysilicon is widely used as the material to fabricate the gate electrode, the compatibility of the fabrication process may be increased.

In some embodiments, the dummy gate layer may also be made of silicon oxide, silicon nitride, silicon oxynitride, silicon carbide, or amorphous silicon, etc.

Further, in some embodiments, the dummy gate structure may be a multiple-layer structure. That is, the gate structure may be a multiple-layer structure, including a dummy oxide layer and a dummy gate layer on the dummy oxide layer. The dummy oxide layer may be made of silicon oxide, or silicon oxynitride, etc.

The first mask gate structure 162 may be used to cover a portion of the second well region 100n adjacent to the first well region 100p. Thus, the location of the doped drain regions in the second well region 100n may be defined Because the first mask gate structure 162 may be on a portion of the second region 102n adjacent to the first region 101n, a portion of the second region 102n away from the first region 101n may be exposed. The doped drain regions may be thus in the second region 102n on the side of the first mask gate structure 162 away from the first well region 100p.

The disposition of the first mask gate structure 162 to cover a portion of the second region 102n adjacent to the first region 101n may allow the doped drain regions to be in the second region 102n away from the first region 101n. Thus, the distance between the doped drain regions in the second well region 100n and the doped source regions in the first well region 100p may be efficiently increased. Accordingly, the distance between the source regions and the drain regions of the semiconductor structure may be increased. Thus, the length of the current path of the semiconductor structure may be further increased when the semiconductor structure is in operation; and the voltage withstanding performance of the semiconductor structure may be further enhanced.

In one embodiment, the first mask gate structure 161 may also be formed on a portion of the first insulation layer 111. That is, the first mask gate structure 161 may also be formed on a portion of the second region 102n of the second well region 100n and a portion of the first insulation layer 111.

Such a configuration may increase the process window for forming the first mask gate structure 161. Thus, the difficulty for forming the first mask gate structure 161 may be reduced; and the yield may be increased; and the performance of the semiconductor structure may be improved.

In one embodiment, the semiconductor structure is a fin field-effect transistor. The base substrate may include the substrate 100, the first fins 101 and the second fins 102. Therefore, the first mask gate structure 162 may be on the second fins 102.

The semiconductor structure may also include a second insulation layer 112 between the adjacent second fins 102. The second insulation layer 112 may also cover portions of the top surfaces of the second fins 102. Therefore, the first mask gate structure 162 may be on the second insulation layer 112.

The second mask layer 112 may cover portions of the top surfaces of the second fins 102 and portions of the side surfaces of the second fins 102 facing the first fins 101. Therefore, the first mask gate structure 162 may be on portions of the top surfaces of the second fins 102 and top portions of the side surfaces of the second fins 102 facing the first fins 101.

In one embodiment, a second insulation layer 112 may be between the adjacent second fins 102. The second insulation layer 112 may cover portions of the top surfaces of the second fins 102. Therefore, the first mask gate structure 162 may only be on the second fins 102 and may not be across the second fins 102, or may not cover the side surfaces of the second fins 102. The reduced covered area between the first mask gate structure 162 and the second fins 102 may efficiently enhance the electrical insulation performance between the first mask gate structure 162 and the second fins 102, the occurrence of a leakage current in the first mask gate structure 162 may be reduced; and the performance of the semiconductor structure may be improved.

Further, the second insulation layer 112 may also be on the side surfaces of the second fins 102 facing the first fins 101. That is, the second insulation layer 112 may be used for the electrical insulation between the first mask gate structure 162 and the side surfaces of the second fins 102 facing the first fins 101.

In one embodiment, the first mask gate structure 162 and the gate structure 161 are made of a same material. Thus, the first mask gate structure 162 and the gate structure 161 may be formed by a same process; and the fabrication process may be simplified; and the use of the etching mask may be reduced. Accordingly, the production cost may be reduced; and the process efficiency may be improved. In some embodiments, the first mask gate structure and the gate structure may be made of different materials.

In one embodiment, the gate structure 161 is a metal gate structure. Thus, the first mask gate structure 162 may be a first metal mask gate structure. Specifically, the first metal mask gate structure 162 may include a gate dielectric layer on a portion of the second well region 100n adjacent to the first well region 100p, a work function layer on the gate dielectric layer, and a metal material layer on the work function layer.

Similar to the gate structure, in some embodiments, the first mask gate structure may also be a dummy gate structure. When the first mask gate structure is a dummy gate structure, the dummy gate structure may be a single layer structure, including a first dummy mask gate layer. The first dummy mask gate layer may be made of polysilicon.

Using polysilicon as the material of the first mask gate structure 162 may reduce the fabrication difficulty; and may improve the yield. Further, polysilicon is widely used as the material to fabricate gate structures. Thus, the process compatibility may be increased.

Further, in some embodiments, the dummy gate structure may be a multiple-layer structure. That is, the first mask gate structure may be a multiple-layer structure, including a dummy oxide layer and a dummy gate layer on the dummy oxide layer. The dummy oxide layer may be made of silicon oxide, or silicon oxynitride, etc.

The doped source regions and the doped drain regions may be used to form the source regions and the drain regions of the semiconductor structure.

In one embodiment, the first well region 100$p$ may be a lateral diffusion region; and the second well region 100$n$ may be a drift region. Therefore, the doped source regions in the first well region 100$p$ may be used to form the source regions of the semiconductor structure; and the doped drain regions in the second well region 100$n$ may be used to form the drain regions of the semiconductor structure.

Because the gate structure 161 may be on the top surface of the first region 100$p$ and the first region 101$n$ of the second well region 100$n$, the gate structure 161 may cover a portion of the first well region 100$p$ adjacent to the second well region 100$n$; and expose a portion of the first well region 100$p$ away from the second well region 100$n$. Thus, the doped source regions may be in the first well region 100$p$ at the side of the gate structure 121 away from the second well region 100$n$.

The first mask gate structure 162 may be on a portion of the second region 102$n$ adjacent to the first region 101$n$; and the first mask gate structure 162 may cover a portion of the second region 102$n$ of the second well region 100$n$ adjacent to the first well region 100$p$. Thus, the doped drain regions may be in the second region 102$n$ at the side of the first mask gate structure 162 away from the first well region 100$p$.

Therefore, the distance between the doped drain regions in the second well region 100$n$ and the doped source regions in the first well region 100$p$ may be sufficiently large. That is, the distance between the source regions and the drain regions of the semiconductor structure may be sufficiently large. Thus, the length of the current paths in the semiconductor structure may be increased when the semiconductor structure is in operation, and the voltage withstanding performance of the semiconductor structure may be enhanced.

In one embodiment, the semiconductor structure may also include a first stress layer 131 in the first well region 100$p$. The first stress layer 131 may be in the first well region 100$p$ exposed by the gate structure. The semiconductor structure may also include a second stress layer 132 in the second well region 100$n$. The second stress layer 132 may be in the second region 102$n$ of the second well region 100$n$ exposed by the first mask gate structure.

The first stress layer 131 may be used to form the doped source regions in the first well region 100$p$. The second stress layer 132 may be used to form the doped drain regions in the second well region 100$n$.

In one embodiment, the semiconductor structure is an N-type fin field-effect transistor. Thus, the first stress layer 131 and the second stress layer 132 may be made of N-type doped Si, or SiC, etc.

To improve the quality of the first stress layer 131 and the second stress layer 132 and the performance of the semiconductor structure, in one embodiment, as shown in FIG. 10, the semiconductor structure may also include a second mask gate structure 163 on the first well region 100$p$. There may be a gap between the second mask gate structure 163 and the gate structure 161. Such a gap may be at the side of the gate structure 161 away from the first insulation layer 111. The semiconductor structure may also include a third mask gate structure 164 on the top surface of the second region 102$n$ of the second well region 100$n$. There may be a gap between the third mask gate structure 164 and the first mask gate structure 161. Such a gap may be at the side of the first mask gate structure 162 away from the first insulation layer 111.

The second mask gate structure 163, along with the gate structure 161, may be used to define the size and the location of the first stress layer 131. The third mask gate structure 164, along with the first mask gate structure 162, may be used to define the size and the location of the second stress layer 132.

Therefore, the first stress layer 131 may be between the second mask gate structure 163 and the gate structure 161. The second stress layer 132 may be between the third mask gate structure 164 and the first mask gate structure 162.

In one embodiment, the second mask gate structure 163 and the third mask gate structure 164 are made of the same material as the first mask gate structure 161. That is, the second mask gate structure 163, the third mask gate structure 164 and the first mask gate structure 162 may be made of the same material as the gate structure 161. Therefore, the second mask gate structure 163, the third mask gate structure 164, the first mask gate structure 162 and the gate structure 161 may be formed by a same process. Therefore, the fabrication process may be simplified; and the production cost may be reduced. In some embodiments, the second mask gate structure 163 and the third mask gate structure 164 may be made of a material different from the material of the first mask gate structure 162.

The gate structure 161 may be a metal gate structure; the first mask gate structure 162 may be a first metal mask gate structure; the second mask gate structure 163 may be a second metal mask gate structure; and the third mask gate structure 164 may be a third metal mask gate structure.

The second metal mask gate structure 163 may include a gate dielectric layer on the portion of the first well region 100$p$ away from the first insulation layer 111, a work function layer on the gate dielectric layer, and a metal material layer on the work function layer.

The third metal mask gate structure 164 may include a gate dielectric layer on the portion of the second region 102$n$ of the second well region 100$n$ away from the first insulation layer 111, a work function layer located on the gate dielectric layer, and a metal material layer on the work function layer.

Further, the semiconductor structure may also include sidewall spacers (not shown) on the gate structure 161, the first mask gate structure 162, the second mask gate structure 163 and the third mask gate structure 164. The sidewall spacers may be made of silicon oxide, silicon nitride, silicon carbide, silicon carbonitride, silicon oxynitride, silicon caronoxynitride, boron nitride, or boron oxynitride, etc. The sidewall spacers may be single-layer structures or multi-layer structures. In one embodiment, the sidewall spacers are single-layer structure; and made of silicon nitride.

Further, in one embodiment, the semiconductor structure may also include a dielectric layer 140 on the base substrate exposed by the gate structure 161 and the first mask gate structure 162. The dielectric layer 140 may expose the gate structure 161 and the first mask gate structure 162.

The dielectric layer 140 may be an interlayer dielectric layer. The dielectric layer 140 may be used for the electrical insulation between semiconductor structures.

In one embodiment, the dielectric layer 140 is made of silicon oxide. In some embodiments, the dielectric layer may also be made of silicon nitride, silicon oxynitride, silicon oxycarbonitride, or other materials.

In one embodiment, the second mask gate structure 163 and the third mask gate structure 164 may be formed on the base substrate. Thus, the dielectric layer 140 may be on the base substrate exposed by the gate structure 161, the first mask gate structure 162, the second mask gate structure 163 and the third mask gate structure 164. The gate structure 161, the first mask gate structure 162, the second mask gate structure 163 and the third mask gate structure 164 may also be exposed by the dielectric layer 140.

Thus, in the present disclosure, the first mask gate structure may be formed on a portion of the second region of the second well region adjacent to the first region, the doped drain regions may be subsequently formed in the second region of the second well region exposed by the first mask gate structure. Because the doped drain regions may be formed in the second region of the second well region exposed by the first mask gate structure, that is, the doped drain regions may be at one side of the first mask gate structure away from the first well region, the distance between the doped drain regions in the second well region and the doped source regions in the first well region may be increased. Thus, the distance between the source regions and the drain regions of the semiconductor structure may be increased. Accordingly, the length of the current path of the semiconductor structure may be increased when the semiconductor structure is in operation; and the voltage withstanding performance of the semiconductor structure may be enhanced.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor structure, comprising:
    a base substrate, having a first well region doped with a first type of doping ions and a second well doped with a second type of doping ions;
    a first insulation layer over the base substrate in the second well region and dividing the second well region into a first region adjacent to the first well region, a second region away from the first well region and a third region under the first insulation layer;
    a gate structure over the base substrate in the first well region and the first region of the second well region;
    a first mask gate structure over the base substrate and on a portion of the second region adjacent to the first region;
    a first stress layer on the first well region at a side of gate structure away from the first insulation layer; and
    a second stress layer on the second well region at a side of the mask gate structure away from the first insulation layer, wherein the semiconductor structure is a fin field-effect transistor, wherein:
    the base substrate includes a semiconductor substrate, a plurality of first fins and a plurality of second fins on the semiconductor substrate and distributed on the semiconductor substrate along a length direction of the first fins and second fins;
    the first well region is in the first fins;
    the second well region is adjacent to the first well region in the first fins and further extended into the second fins;
    the first insulation layer is between the first fins and the second fins and covers portions of side surfaces of the first fins adjacent to the second fins;
    a second insulation layer is formed covering portions of top surface of the second fins;
    the first mask gate structure is on the second fins; and
    an oxide layer between the gate structure and the first fins, with a thickness smaller than a thickness of the second insulation layer.

2. The semiconductor structure according to claim 1, wherein:
    a top surface of the second insulation layer is above top surfaces of the second fins;
    the second insulation layer covers portions of the top surfaces of the second fins; and
    the first mask gate structure is on the second insulation layer.

3. The semiconductor structure according to claim 1, further comprising:
    source regions in the first well region exposed by the gate structure and formed from the first stress layer; and
    drain regions in the second region of the second well region exposed by the first mask gate structure and formed from the second stress layer.

4. The semiconductor structure according to claim 3, further comprising:
    a second mask gate structure on the first well region, spaced apart from the gate structure at a side of the gate structure away from the first insulation layer; and
    a third mask gate structure on the second region of the second well region, spaced apart from the first mask gate structure at a side of the first gate structure away from the first insulation layer,
    wherein:
    the first stress layer is between the second mask gate structure and the gate structure; and
    the second stress layer is between the third mask gate structure and the first mask gate structure.

5. The semiconductor structure according to claim 1, wherein:
    the gate structure and the first mask gate structure are made of a same material.

6. The semiconductor structure according to claim 1, wherein:
    the gate structure is a metal gate structure; and
    the first mask gate structure is a first metal mask gate structure.

7. The semiconductor structure according to claim 1, wherein:
    the gate structure includes a dummy gate structure;
    the first mask gate structure includes a first dummy mask gate structure; and
    the dummy gate structure and the first dummy mask gate structure are made of polysilicon.

8. A method for fabricating a semiconductor structure, comprising:
    providing a base substrate having a first well region doped with a first type of doping ions and a second well region doped with a second type of doping ions adjacent to the first well region;
    forming a first insulation layer over the base substrate in the second well region, wherein the first insulation layer divides the second well region into a first region adjacent to the first well region, a second region away from the first well region and a third region under the first insulation layer;

forming a gate structure on the first well region and a first mask gate structure on the second well region, wherein the gate structure is also formed on the first region of the second well region and the first mask gate structure is formed on a portion of the second region adjacent to the first region; and forming a first stress layer on the first well region at a side of gate structure away from the first insulation layer and a second stress layer on the second well region at a side of the mask gate structure away from the first insulation layer, wherein the first stress layer and the second stress layer are located on opposite sides of the first insulation layer and isolated from the first insulation layer by the gate structure and the first mask gate structure, respectively, wherein the semiconductor structure is a fin field-effect transistor, the base substrate includes a semiconductor substrate, a plurality of first fins and a plurality of second fins on the semiconductor substrate and distributed along a length direction of the first fins and the second fins, the first well region and the second well region are in the first fins and distributed along a direction toward the second fins, and the second well region extends into the second fins, wherein:

forming the first insulation layer in the second well region includes forming the first insulation layer between the first fins and the second fins, wherein the first insulation layer covers portions of side surfaces of the first fins adjacent to the second fins; and forming the gate structure and the first mask gate structure includes forming the first gate structure on the first fins and the first mask gate structure on the second fins, wherein the first gate structure is across the first fins and on portions of top surfaces and side surfaces of the first fins and the first mask gate structure is on the second fins; a number of the second fins is greater than one, further comprising: forming a second insulation layer between adjacent second fins when forming the first insulation layer, wherein: a top surface of the second insulation layer is above top surfaces of the second fins; the second insulation layer covers portions of top surfaces of the second fins; and forming the first mask gate structure includes forming the first mask gate structure on the second insulation layer; forming the first insulation layer comprises: forming an insulation material layer on the base substrate exposed by the first fins and the second fins to cover top surfaces of the first fins and the second fins; and forming the first insulation layer by performing an etch-back process on the insulation material layer, wherein the etch-back process includes: performing a first etch-back process on the insulation material layer to reduce a thickness of the insulation material layer on the second fins; forming an insulation mask layer on the etched insulation material layer and on portions of the second fins adjacent to the first fins; and performing a second etch-back process on remaining insulation material layer using the insulation mask layer as the etching mask to form the first insulation layer and the second insulation layer under the insulation mask layer.

9. The method according to claim 8, wherein:
the first mask gate structure is also formed on a portion of the first insulation layer.

10. The method according to claim 8, wherein forming the gate structure and the first mask gate structure comprises:
forming the gate structure and the mask gate structure with a same material.

11. The method according to claim 8, after forming the first stress layer and the second stress layer, further comprising:
forming source regions from the first stress layer; and
forming drain regions from the second stress layer.

12. The method according to claim 11, after forming the first insulation layer and before forming the first stress layer and the second stress layer, further comprising:
forming a second mask gate structure on the first well region and a third mask gate structure on the second region of the second well region,
wherein:
the second mask gate structure is spaced apart from the gate structure at a side of the gate structure away from the first insulation layer;
the third mask gate structure is spaced apart from the first mask gate structure at a side of the first gate structure that is away from the first insulation layer;
forming the first stress layer includes forming the first stress layer between the second mask gate structure and the gate structure; and
forming the second stress layer includes forming the second stress layer between the third mask gate structure and the first mask gate structure.

13. The method according to claim 11, wherein the gate structure is a dummy gate structure, and the method further comprises:
forming a dielectric layer on the base substrate exposed by the gate structure after forming doped the source/drain regions;
removing the gate structure to form a gate opening; and
forming a metal gate structure in the gate opening.

14. The method according to claim 13, wherein the gate structure includes a dummy gate structure, and the first mask gate structure includes a first dummy mask gate structure, wherein forming the gate opening comprises:
removing the dummy gate structure to form the gate opening;
removing the first dummy mask gate structure to form a first dummy mask gate opening when forming the gate opening;
forming a first metal mask gate structure in the first mask gate opening when forming the metal gate structure.

* * * * *